United States Patent [19]

Mountz et al.

[11] Patent Number: 5,087,888
[45] Date of Patent: Feb. 11, 1992

[54] LIGHT WEIGHT POWER AMPLIFIER ASSEMBLED WITH NO HAND SOLDERING OR SCREWS

[75] Inventors: Michael C. Mountz, Carol Stream; Peter A. Kwitkowski, St. Charles, both of Ill.

[73] Assignee: Motorola, Inc., Schaumburg, Ill.

[21] Appl. No.: 557,814

[22] Filed: Jul. 26, 1990

[51] Int. Cl.[5] ............................................. H03F 1/00
[52] U.S. Cl. ..................................... 330/65; 330/68; 361/383; 361/394
[58] Field of Search .................. 330/65, 66, 68, 289; 361/383, 393-395

[56] References Cited

U.S. PATENT DOCUMENTS 2,894,077  7/1959  McCoy ................................ 330/66
4,963,833 10/1990  Mountz ............................ 330/68 X Primary Examiner—James B. Mullins
Attorney, Agent, or Firm—Jon Christensen

[57] ABSTRACT

A way of constructing modular RF power amplifiers. RF power amplifiers are constructed of a standardized chassis plus a number of RF power modules with each such power module containing provisions for self-cooling.

10 Claims, 1 Drawing Sheet

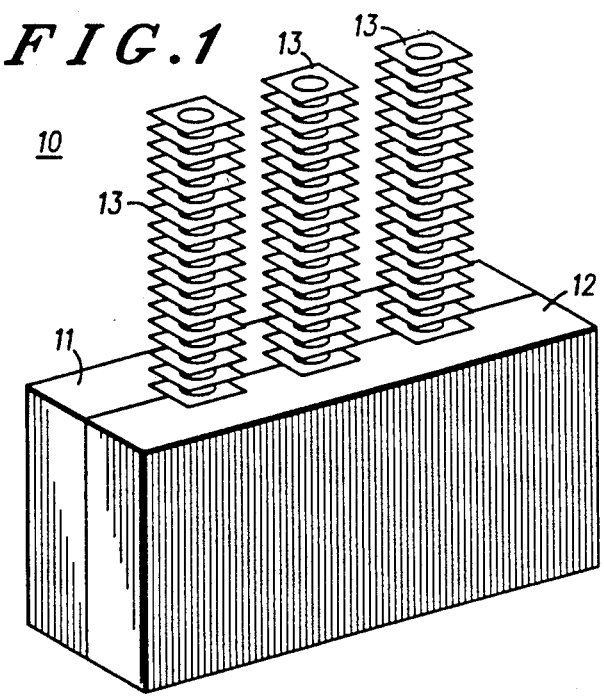
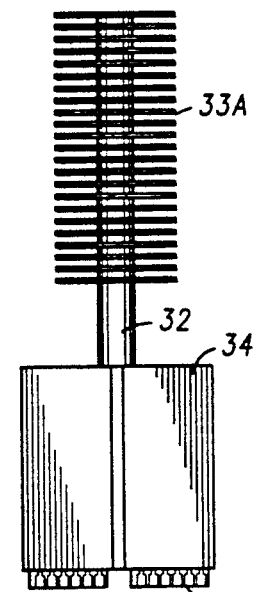
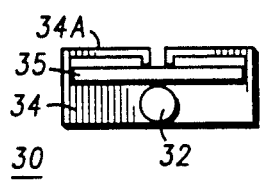
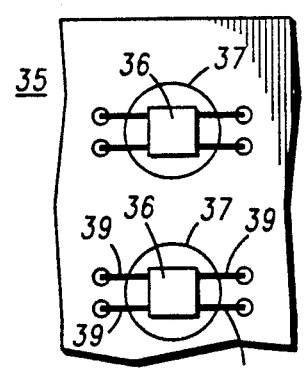
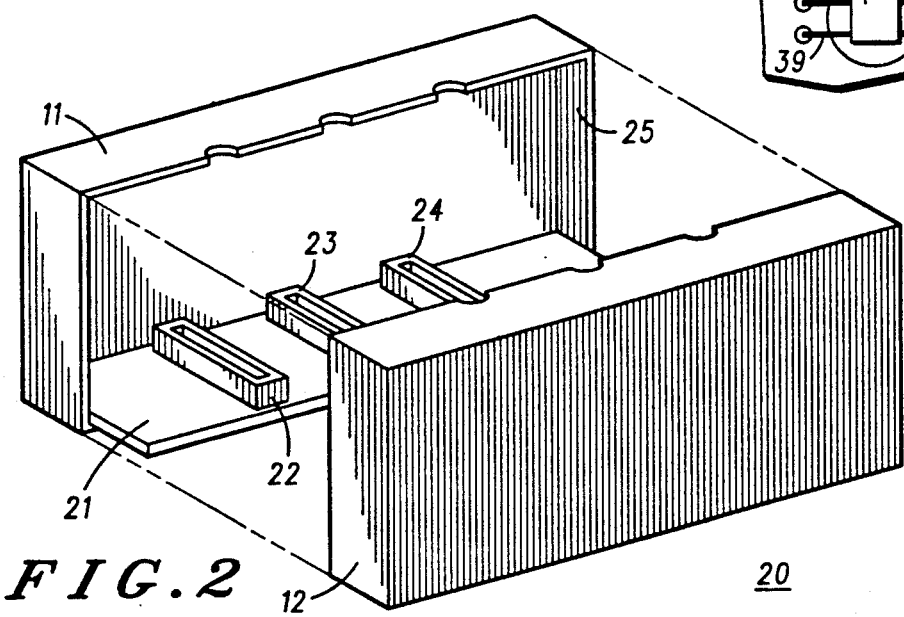

LIGHT WEIGHT POWER AMPLIFIER ASSEMBLED WITH NO HAND SOLDERING OR SCREWS

TECHNICAL FIELD

This invention relates to the construction of power amplifiers and more specifically to the construction of radio frequency power amplifiers.

BACKGROUND

Radio frequency power amplifiers (RFPAs) are known. Such amplifiers are typically constructed to provide a power output in a range of from a few tenths of a watt to kilowatts and in a frequency range of from a few kilohertz into the megahertz range.

RFPAs, as is known, typical receive an input signal consisting of a modulated RF signal from a signal generation circuit in a base station (external to the RFPA) at a level of from one to several hundred milliwatts magnitude. In its simplest form a RFPA receives the input signal in the milliwatt range and amplifies it to its final value which may then be applied to a transmitting antenna.

In the creation of an RFPA a number of power amplifying devices of varying signal gain characteristics and power handling capabilities may be combined. Overall gain requirements may be obtained by connecting a number of amplifier stages in series, with the overall gain characteristic of the RFPA being equal to the product of the individual stages minus any losses incurred. The use of circuitry splitting the RF signal for application to a plurality of parallel amplifying devices is also often employed to increase the power output capabilites of the RFPA above that available with a single amplifying device. Combining circuitry may then be used to sum the outputs of the individual amplifying stages.

Also present within a RFPA and often combined with amplifying devices is a compensation function. In general a compensation function (or functions) may be defined as being provided by any circuit containing low-pass or high-pass filters, ferrite isolators, temperature or current sensing circuits, output power, and/or reflected power sensing circuits.

The compensation function (or functions) within a RFPA may be accomplished by a variety of methods. One method is through the use of a compensation circuit combined with the amplification circuit. Another way is through the use of splitter and combiner circuits, separate and apart from the amplification circuit. Still further methods include the use of low-pass or high pass filters. Directional couplers may also be used.

Depending on the type of RF amplifying devices, used, one or a combination of the above compensation methods may be used. Amplification and compensation may be combined into a single circuit or may be separated into multiple circuits installed on multiple circuit boards.

Of the RFPAs constructed in the prior art, very little standardization has occurred. In part the reason for the non-standardization relates to RF devices or to the frequency ranges over which an RFPA operates. Each RF device or frequency range, in the past, has tended to generate its own compensation requirements.

In addition, RF power devices of different power levels are typically constructed with a variety of different case configurations and cooling requirements. Differing case configurations often necessitate minor modifications in mounting provisions.

Cooling requirements are typically met through the use of heat sinks and fans where required. The larger the power output of an RF device the larger the heat sink that may be needed. Larger heat sinks, on the other hand, tend to become disproportionately less efficient as output power increases. High power RF devices a few times larger than a smaller unit occasionally require heat sinks many times larger than that of the smaller unit.

Varying RFPA designs in general are inefficient from the standpoint of engineering resource utilization resulting in increased design costs. Varying size and shape, totally apart from amplification considerations, cause hidden costs in accommodating RFPAs in radio systems and assemblies. A need exists for standardization.

SUMMARY OF THE INVENTION

Pursuant to one embodiment of the invention a modular RF power amplifier is constructed having a standarized chassis and at least one self-cooled module (function module) containing circuits providing radio functions such as amplification and/or compensation. The RF amplifier is constructed with standardized interconnects such that another function module of a higher (or lower) power can be interchangeably installed in the amplifier. Another function module of the same power but a different frequency could also be interchangeably installed in the amplifier chassis. External connections are provided on the chassis to interconnect an external RF input and the function module and between the amplified RF output and an external RF connection.

To accommodate the function modules the chassis is constructed to contain an interconnect board with multiple insertion slots for function modules. Each insertion slot on the interconnect board, in addition to providing mechanical constraint for the module, also contains at least one electrical interface connector. The interface connector and interconnect board provide electrical interconnection between the interface connectors of adjacent or non-adjacent slots as well as electrical connections with external devices. The electrical connections with external devices include conductors for introducing the RF input signal to the function modules, routing the amplified signal to an external load, supplying DC power and providing control and metering functions.

In one embodiment of the invention a low power RFPA contains a single function module. The function module contains RF power devices, compensation circuits, and compensation circuits mounted on a three by four inch ceramic circuit card located within the function module. The input signal enters the function module through an interface connector. The output signal leaves by the same method.

In another embodiment a low or medium power RFPA may contain the RF power devices on one function module and compensation circuitry in an adjacent function module. A high power RFPA may contain RF power devices in a number of different function modules. Compensation circuitry may be contained in a number of other function modules.

RF power devices contain provisions for self-cooling in the form of heat pipes. The use of self-cooling allows function modules containing heat generating power devices to be interspersed with other modules (containing other devices such as compensation circuits) that generate less heat output, thereby avoiding special (or extra) provisions for cooling.

In one embodiment of the invention the chassis contains integral RF and environmental shielding. The integral shielding (FIGS. 2, 25) is comprised of a conductive coating covering the inside of a non-perforated chassis cover. The conductive coating allows a chassis to be constructed of a less expensive material such as plastic.

The heat pipes and internal coating of the chassis (25) are also interconnected to an amplifier ground (not shown) located on the interconnect board (21). The use of the interconnected ground comprises an integral PA system ground.

The RFPA modules are constructed to be inserted into the RF chassis by hand and without tools. Chassis covers are also constructed with integral hand actuated assembly fasteners.

BRIEF DESCRIPTION OF THE DRAWINGS

FIG. 1 comprises a perspective depiction of a RFPA.

FIG. 2 comprises a perspective exploded view of an RFPA chassis without function modules.

FIGS. 3A and 3B comprise a depiction of a compensation function module.

FIG. 4 comprises a depiction of a power function module.

FIG. 5 comprises a depiction of a ceramic PC card from a function module.

BEST MODE FOR CARRYING OUT THE INVENTION

FIG. 1 depicts an assembled RFPA chassis generally (10). As shown the RFPA chassis comprises two halves (11 and 12) joined along a center line through which pass the heat pipes for three self-cooling function modules (13).

FIG. 2 depicts an exploded view of a RFPA chassis (20) with the function modules (13) removed. As shown an interconnect board (21) is mounted in a slot (not shown) along the bottom of the RFPA chassis. A number of interface connectors (22, 23, and 24) may be mounted to the interconnect board for connections between the interconnect board (21) and the function modules (not shown in FIG. 2) and between individual function modules (not shown in FIG. 2). Also mounted on the chassis (20) are the coaxial connectors (not shown) used to introduce the modulated RF signal into the RFPA and the coaxial connector used to route the output of the RFPA to an external load.

Mounted within the RFPA chassis (20 in FIG. 2) are the function modules (13) used to amplify the RF signal. Shown (FIG. 3A and FIG. 3B) is a compensation function module (30) (general use function module). The function module (30) is interconnected with the RFPA chassis by an interface connector (31) located at the bottom of the function module (30). The function module (30) is constructed with sufficient space on the heat pipe (32) between the bottom of the fins (33) and the top of a function module cooling block (34) to allow the function module (30) to be inserted into the RFPA chassis (20) without engagement of the interconnect connectors (22, 23, and 24). Following insertion of the function module (30) into the RFPA chassis (20) the function module (30) is then seated, by direct pressure, into the interconnect connectors (22, 23, and 24).

Heat generated within the function module (30) is dissipated by the heat pipe fins (33). In one embodiment of the invention compensation circuitry within the function module (30) is mounted on one side of a three by four inch ceramic printed circuit (PC) card (35). The opposite side of the ceramic PC card (35) is clad in a heat and electrical conducting material held in intimate contact with a heat dissipation block (34) by compression clamps (34a). The heat dissipation block (34) is, in turn, held in intimate contact with the heat pipe (32).

Medium power or high power RFPA amplifiers (FIG. 4), on the other hand, may require slightly modified function modules to achieve adequate cooling of power devices at higher power levels. Higher power RFPAs may contain RF power amplifying devices (such as power transistors) that may require direct contact with the heat dissipation block (34) for adequate cooling. Shown (FIG. 5) is the ceramic PC card (35) from a medium or high power function module (30). The power amplifier (36) is mounted in direct contact with the heat dissipation block (34) through a hole (37) in the ceramic PC card (35). The RF power amplifier (36) is retained in position on the ceramic PC card (35) by metallic leads (39) joining and interconnecting the power amplifier (36) to te ceramic PC card (35).

To compensate for differences in thicknesses of the power amplifier (36) and the ceramic PC card (35) a slot (38 in FIG. 4) may also be milled into the heat dissipation block (34). The entire assembly (power amplifiers (36) and the ceramic PC card (35), is then held in intimate contact wtih the heat dissipation block through the interaction of compression clamps (34a) joined to the heat dissipation block (34).

To achieve higher power levels a combination of function modules (FIGS. 3 and 4) may be required. Power amplifier devices may be mounted to function modules adapted for high power use (FIG. 4) (i.e. for large heat dissipation). Compensation circuits (splitter-combiners, filters, directional couplers, etc.) may be mounted on general use function boards (FIG. 3, 35).

What is claimed is:

1. A modular RF power amplifier comprising:
   A) at least one self-cooled RF function module;
   B) a RFPA chassis for operably receiving the at least one self-cooled function module;
   C) means for interchangeably installing within the chassis an RF function module of a first power level and, upon occasion, a second power level;
   D) means for interchangeably installing within the chassis an RF function module of a first frequency and, upon occasion, a second frequency;
   E) means for communicating an RF input signal from an input connector to an input of the at least one RF function module.
   F) means for communicating an amplified RF output signal from the RF function module to an output connector.

2. The apparatus as in claim 1 wherein the self-cooled RF function module contains a heat-pipe.

3. The apparatus as in claim 1 wherein the means for interchangeably installing a RF function module of a first power level and a second power level and the means for interchangeably installing a RF function module of a first frequency and a second frequency comprise at least one interface connector.

4. The apparatus as in claim 1 wherein the RFPA chassis contains integral RF shielding.

5. The apparatus as in claim 1 wherein the RFPA chassis contains integral grounding.

6. The apparatus as in claim 1 wherein the RF chassis contains integral hand actuated assembly fasteners.

7. A method of constructing modular RF power amplifiers having:
   A) at least one self-cooled RF function module;
   B) means for interchangeably installing RF function modules of a first power level and, upon occasion, a second power level;
   C) means for interchangeably installing RF function modules of a first frequency and, upon occasion, a second frequency;
   D) means for communicating an input modulated, RF signal to the at least one RF function module; and,
   E) means for communicating an amplified signal to a point of use;
such method comprising:
   A) designing a RFPA containing amplification and compensation circuits to provide a selected power output at a selected frequency;
   (B) constructing the RFPA with the amplification and compensation circuits contained in an at least one self-cooling function module of the selected power and frequency;
   C) designing an RFPA chassis to contain a plurality of self-cooling function modules;
   D) constructing an RFPA chassis to contain the plurality of self-cooling function modules; and,
   E) assembling the RFPA chassis and function modules.

8. The method as in claim 7 wherein the step of designing the RFPA chassis further includes the step of shielding the RF power amplifier chassis with a conductive coating.

9. The method as in claim 7 wherein the step of designing the RFPA chassis further includes the step of grounding the RF power amplifier chassis from within an interconnect board.

10. The method as in claim 7 wherein the RFPA chassis and function modules contain hand actuated assembly fasteners.

* * * * *